United States Patent [19]

Kawamura et al.

[11] 4,011,519
[45] Mar. 8, 1977

[54] TRANSISTOR AMPLIFIER CIRCUIT

[75] Inventors: Masami Kawamura, Kodaira; Yukio Suzuki, Tokyo, both of Japan

[73] Assignee: Hitachi, Ltd., Japan

[22] Filed: July 30, 1975

[21] Appl. No.: 600,431

[30] Foreign Application Priority Data

Aug. 2, 1974 Japan ............... 49-88082

[52] U.S. Cl. .................... 330/29; 330/22; 330/30 D
[51] Int. Cl.$^2$ ......................... H03G 3/30
[58] Field of Search .......... 330/20, 29, 30 D, 22

[56] References Cited
UNITED STATES PATENTS

| | | | |
|---|---|---|---|
| 3,761,741 | 9/1973 | Hoeft | 330/30 D X |
| 3,803,505 | 4/1974 | Ishigaki et al. | 330/29 |

Primary Examiner—R. V. Rolinec
Assistant Examiner—Lawrence J. Dahl
Attorney, Agent, or Firm—Craig & Antonelli

[57] ABSTRACT

A cascode type transistor amplifier circuit having an improved signal-to-noise ratio characteristic, wherein a parallel circuit which consists of a resistance of comparatively large value and a diode is disposed on the emitter side of one of a pair of differential transistors and wherein a variable absorption current circuit is disposed on the emitter side of a grounded-emitter amplifying transistor, the absorption current of the variable absorption current circuit being controlled so as to decrease with increase in the input signal level.

4 Claims, 4 Drawing Figures

TRANSISTOR AMPLIFIER CIRCUIT

BACKGROUND OF THE INVENTION

This invention relates to transistor amplifier circuits, and more particularly it is directed to a transistor amplifier circuit of the cascode type.

As a transistor amplifier circuit having the gain control function, one of the cascode type is known. This amplifier circuit has the operating point and the bias current of an amplifier transistor kept constant even when a gain control signal AGC changes. It is accordingly capable of providing gain control over a wide range without bringing about changes in the dynamic range and the input impedance of the amplifier circuit.

This amplifier circuit, however, involves the problem that, where a resistance is connected to the emitter of the amplifier transistor in order to expand the input dynamic range, the signal-to-noise ratio of an amplified signal output is conspicuously degraded in dependence on the state of the gain control.

As a cascode type amplifier circuit to solve this problem, one is known which is disclosed in Japanese Patent Application Publication No. 6961/1970 entitled "Amplifier Circuit." According to this amplifier circuit, a resistance is incorporated on the emitter side of an output side transistor of a pair of differential transistors, and the gain of the differential amplifier circuit is lowered. Thus, improvements in the signal-to-noise ratio are intended.

It has been revealed, however, that the value of the resistance cannot be made very large due to restrictions of the bias current and the base potential of the differential transistor, so that noises beyond certain bounds cannot be prevented from entering by means of the resistance, resulting in degradation of the output signal-to-noise ratio.

SUMMARY OF THE INVENTION

This invention has been made in order to solve the problem stated above. It has for its object to achieve betterment in the signal-to-noise ratio of the cascode type transistor amplifier circuit.

The fundamental construction of this invention for accomplishing the object is characterized in that in a transistor amplifier circuit of the cascode type, a parallel circuit consisting of a resistance of comparatively large value and a diode is provided on the emitter side of one of a pair of differential transistors, and that a variable absorption current circuit is provided on the emitter side of an amplifier transistor, the absorption current of said current circuit being controlled so as to decrease with increase in the input signal level.

PREFERRED EMBODIMENTS OF THE INVENTION

Figure 1:
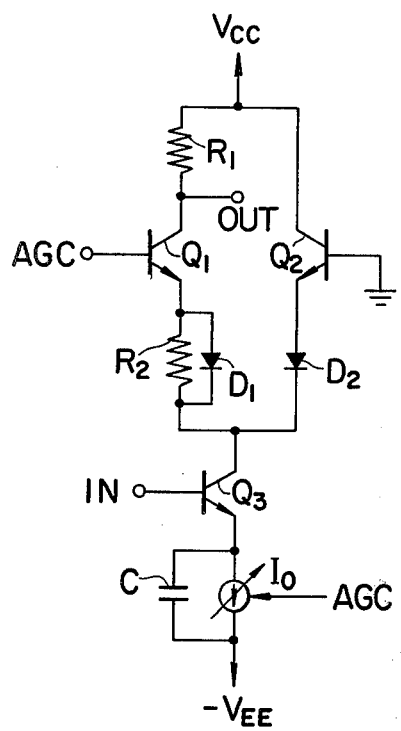
FIG. 1 is a circuit diagram of a cascode type transistor amplifier circuit according to this invention.

Hereunder this invention will be more specifically explained in connection with various preferred embodiments with reference to the drawing.

FIG. 1 is a circuit diagram showing an embodiment of this invention.

As illustrated in the figure, the cascode type transistor amplifier circuit according to this invention is provided with a parallel circuit consisting of a resistance of comparatively large value $R_2$ and a diode $D_1$ and being connected to the emitter of an output transistor $Q_1$, with its collector used for an output terminal, of a pair of differential transistors $Q_1$ and $Q_2$ which are respectively cascode-connected to a grounded-emitter amplifying transistor $Q_3$. In addition, a diode $D_2$ for balancing the differential transistors $Q_1$ and $Q_2$ is connected to the emitter of the other differential transistor $Q_2$.

An AGC (automatic gain control) voltage which lowers with increase in the input signal level is applied to the base of one transistor $Q_1$ of the differential transistors, a reference voltage is applied to the base of the other differential transistor $Q_2$, and an input signal is applied to the base of the amplifying transistor $Q_3$.

Further, a variable absorption current circuit $I_o$ is connected to the emitter of the grounded-emitter amplifying transistor $Q_3$. The absorption current of the current circuit $I_o$ is controlled by a signal dependent upon the input signal level, e. g., by the AGC voltage so that it may decrease with increase in the input signal level.

Figure 2:
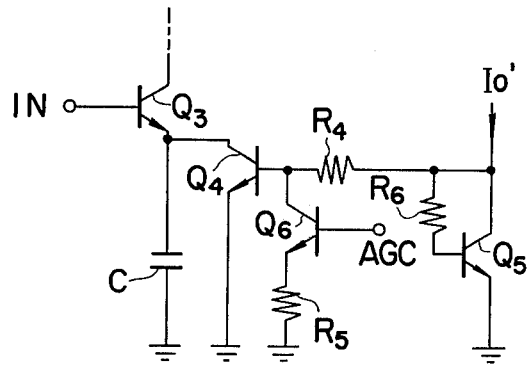
FIG. 2 is a circuit diagram of a variable absorption current circuit included in the transistor amplifier circuit in FIG. 1, and FIGS. 3(a) and 3(b) are circuit diagrams each showing another embodiment of the cascode type transistor amplifier circuit.

The variable absorption current circuit is, for example, as shown in FIG. 2. A constant current $I_o'$ is supplied commonly to a pair of absorbing transistors $Q_4$ and $Q_5$. In order that an absorption current flowing through one transistor $Q_4$ of the absorbing transistors may become a variable absorption current, a transistor $Q_6$ to be controlled by the AGC voltage is connected to the base of the transistor $Q_4$.

In accordance with this invention of the above construction, the object can be accomplished for reasons to be described below.

At a small input signal, the absorption current is comparatively large, so that the equivalent emitter resistance $r_{eQ_3}$ of the amplifying transistor $Q_3$ dependent upon this current has a small value. On the other hand, the AGC voltage is at a positive level, so that the transistor $Q_1$ is in the conductive state whereas the transistor $Q_2$ is in the nonconductive state. In consequence, the transistor amplifier circuit amplifies at a high gain the input signal applied to the base of the amplifying transistor $Q_3$. The amplified A.C. output current is supplied to a load resistance $R_1$. Further, since the AGC voltage is at the positive level, the transistor $Q_1$ and the diode $D_1$ of the differential circuit turn "on" whereas the transistor $Q_2$ and the diode $D_2$ thereof are in the "off" state. Therefore, the gain $G_N$ for noises to be injected from the AGC input is evaluated from the following Eq. (1):

$$G_N = \frac{R_1}{r_{eQ_1} + r_{D_1} + r_{eQ_2} + r_{D_2}} \quad (1)$$

where $r_{eQ_1}$ and $r_{eQ_2}$ denote the equivalent emitter resistances of the respective transistors $Q_1$ and $Q_2$, and $r_{D_1}$ and $r_{D_2}$ the conduction resistances of the respective diodes $D_1$ and $D_2$.

Now that the transistor $Q_2$ and the diode $D_2$ are nonconductive, $r_{eQ_2} \div \infty$ and $r_{D_2} \div \infty$. From Eq. (1), accordingly, the gain at this time becomes $G_N \div 0$, and hence, the signal-to-noise ratio is not degraded.

Subsequently, where the input signal level rises to make the base potentials of the transistors $Q_1$ and $Q_2$ substantially equal, the gain of the transistor amplifier circuit for the input signal lowers. Besides, the absorption current of the absorption current circuit is reduced by the AGC voltage so that the diode $D_1$ may turn "off." That is, a voltage drop across the resistance $R_2$ as caused by the absorption current is reduced below the threshold voltage (approximately 0.7 V) of the diode $D_1$. Thus, the gain $G_N'$ for noises to be injected from the AGC input corresponds to the following Eq. (2):

$$G_N' = \frac{R_1}{r_{eQ_1} + R_2 + r_{eQ_2} + r_{D_2}} \quad (2)$$

Since the value of the resistance $R_2$ can be made large by making the absorption current small, the degradation of the signal-to-noise ratio at this time can be suppressed.

It is to be noted that the absorption current of the absorption current circuit branches and flows through the transistors $Q_1$ and $Q_2$. Accordingly, the absorption current through the resistance $R_2$ is not the whole absorption current of the absorption current circuit. It will be readily understood that, letting $I_{omin}$ denote the minimum value of the absorption current to flow through the resistance $R_2$, the value of the resistance $R_2$ need satisfy the following Eq. (3):

$$R_2 < \frac{0.7}{I_{omin}} \quad (3)$$

This invention is not restricted to the foregoing embodiment, but it can adopt a variety of aspects of performance.

For example, the variable absorption current circuit may have any circuit arrangement as such. Although the control signal has been explained as being the AGC voltage, any other signal dependent upon the input signal level may be employed.

Figure 3A:
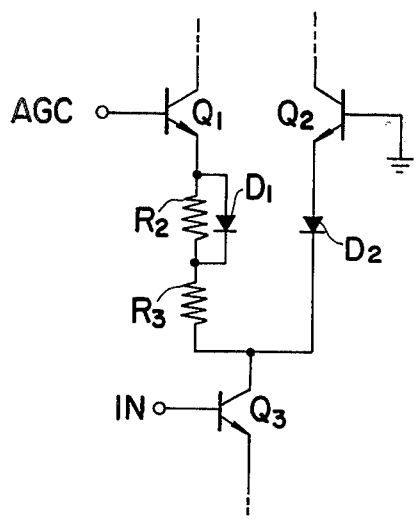
Figure 3B:
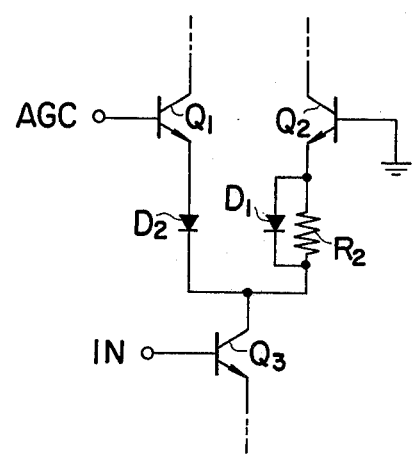

A circuit as shown in FIG. 3(a) may be used in which a resistance of comparatively small value $R_3$ is additionally provided in order to improve the signal-to-noise ratio at the time when the transistor $Q_2$ and the diode $D_2$ turn "on" and when the diode $D_1$ is still in the conductive state. A circuit as shown in FIG. 3(b) may be used in which the emitter circuits of the paired differential transistors $Q_1$ and $Q_2$ are reversed to those in FIG. 1.

Although the diode $D_2$ may be omitted in FIG. 1, the provision is desirable for establishing the balance of the differential circuit. The transistor $Q_2$ may be made an output transistor by providing a load on the collector side thereof.

This invention can be extensively utilized for cascode type transistor amplifier circuits.

We claim:

1. A transistor amplifier circuit comprising a grounded-emitter amplifying transistor, first and second differential transistors, the emitter of said first differential transistor being coupled to the collector of said grounded-emitter amplifying transistor, a parallel circuit which consists of a resistance of comparatively large value and a diode connected between the emitter of said second differential transistor and the collector of said grounded-emitter amplifying transistor, means for applying an input signal to the base of said grounded-emitter amplifying transistor, means for applying an AGC voltage which varies inversely with said input signal to the base of said second differential transistor, and variable absorption current control means connected to the emitter of said grounded-emitter amplifying transistor for controlling the emitter current of said grounded-emitter amplifying transistor so as to decrease said current with increase in said input signal level.

2. The transistor amplifier circuit according to claim 1, further comprising a diode connected between the emitter side of said first differential transistor and the collector of said grounded-emitter amplifying transistor.

3. The transistor amplifier circuit according to claim 1, further comprising a resistance of comparatively small value connected between said parallel circuit and the collector of said grounded-emitter amplifying transistor.

4. The transistor amplifier circuit according to claim 1, wherein said absorption current control means is controlled by said AGC voltage.

* * * * *